US011075276B2

(12) United States Patent
Lin et al.

(10) Patent No.: US 11,075,276 B2
(45) Date of Patent: Jul. 27, 2021

(54) METHODS AND APPARATUS FOR N-TYPE METAL OXIDE SEMICONDUCTOR (NMOS) METAL GATE MATERIALS USING ATOMIC LAYER DEPOSITION (ALD) PROCESSES WITH METAL BASED PRECURSORS

(71) Applicant: APPLIED MATERIALS, INC., Santa Clara, CA (US)

(72) Inventors: Yongjing Lin, San Jose, CA (US); Shih Chung Chen, Cupertino, CA (US); Naomi Yoshida, Sunnyvale, CA (US); Lin Dong, San Jose, CA (US); Liqi Wu, Santa Clara, CA (US); Rongjun Wang, Dublin, CA (US); Steven Hung, Sunnyvale, CA (US); Karla Bernal Ramos, Santa Clara, CA (US); Yixiong Yang, San Jose, CA (US); Wei Tang, Santa Clara, CA (US); Sang-Ho Yu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/594,596

(22) Filed: Oct. 7, 2019

(65) Prior Publication Data

US 2020/0111885 A1 Apr. 9, 2020

Related U.S. Application Data

(60) Provisional application No. 62/742,864, filed on Oct. 8, 2018.

(51) Int. Cl.
*H01L 29/49* (2006.01)
*H01L 29/40* (2006.01)
(Continued)

(52) U.S. Cl.
CPC .... *H01L 29/4975* (2013.01); *H01L 21/02183* (2013.01); *H01L 21/02186* (2013.01); *H01L 21/28518* (2013.01); *H01L 29/401* (2013.01)

(58) Field of Classification Search
CPC .................................................. H01L 29/4975
See application file for complete search history.

(56) References Cited

U.S. PATENT DOCUMENTS

| 10,109,534 B2 | 10/2018 | Brand et al. |
| 2006/0094180 A1 | 5/2006 | Doczy et al. |

(Continued)

OTHER PUBLICATIONS

International Search Report and Written Opinion for PCT/US2019/055014, dated Jan. 30, 2020.

*Primary Examiner* — William A Harriston
(74) *Attorney, Agent, or Firm* — Moser Taboada (57) ABSTRACT

Methods and apparatus for forming a semiconductor structure such as an NMOS gate electrode are described. Methods may include depositing a first capping layer having a first surface atop a first surface of a high-k dielectric layer; and depositing at least one metal layer having a first surface atop the first surface of the first capping layer, wherein the at least one metal layer includes titanium aluminum silicide material. Some methods include removing an oxide layer from the first surface of the first capping layer by contacting the first capping layer with metal chloride in an amount sufficient to remove an oxide layer. Some methods for depositing a titanium aluminum silicide material are performed by an atomic layer deposition process performed at a temperature of 350 to 400 degrees Celsius.

16 Claims, 5 Drawing Sheets

(51) Int. Cl.
*H01L 21/285* (2006.01)
*H01L 21/02* (2006.01)

(56) References Cited

U.S. PATENT DOCUMENTS

| | | |
|---|---|---|
| 2007/0284670 A1 | 12/2007 | Yamamoto et al. |
| 2008/0268635 A1 | 10/2008 | Yu et al. |
| 2010/0048013 A1* | 2/2010 | Thei ................ H01L 21/823842 438/591 |
| 2011/0018073 A1 | 1/2011 | Wang et al. |
| 2011/0121399 A1 | 5/2011 | Park et al. |
| 2013/0292703 A1 | 11/2013 | Horii et al. |
| 2014/0273428 A1 | 9/2014 | Shero et al. |
| 2019/0019874 A1* | 1/2019 | Ma .................... H01L 21/28518 |
| 2019/0057863 A1 | 2/2019 | Yang et al. |
| 2019/0198498 A1* | 6/2019 | Park ...................... H01L 29/775 |

\* cited by examiner

METHODS AND APPARATUS FOR N-TYPE METAL OXIDE SEMICONDUCTOR (NMOS) METAL GATE MATERIALS USING ATOMIC LAYER DEPOSITION (ALD) PROCESSES WITH METAL BASED PRECURSORS

CROSS-REFERENCE TO RELATED APPLICATION

This application claims priority to U.S. Provisional Application Ser. No. 62/742,864 filed on Oct. 8, 2018 (entirely incorporated herein by reference).

FIELD

Embodiments of the present disclosure generally relate to electronic device processing, and more particularly, to vapor deposition processes for metal-containing materials and the compositions of the metal-containing materials by integrated deposition of titanium aluminum silicide films.

BACKGROUND

Metal gate/high-k stacks are being increasingly used in metal-oxide-semiconductor field-effect-transistors (MOS-FETs) in the 10 nm technology node and beyond, however the inventors have observed that many challenges remain in the art. In particular, the rapid growth of mobile devices, internet, and machine learning are demanding greater transistor technology performance to the more advanced nodes (n<10 nm) with low power consumption. This requires the continuation of Moore's Law to shrink the size of one or more transistors while increasing transistor density on a chip. Currently, titanium aluminum (TiAl) is widely used as low work function metal gate material for n-type metal-oxide-semiconductor field-effect-transistors (NMOS transistor) in the industry. However, the inventors have observed the threshold voltage of n-type field-effect-transistors (NFET) devices is problematically high with thin titanium aluminum (TiAl), preventing the further scaling down of transistors.

What is needed in a material suitable for use in n-type transistors suitable use in nodes below 10 nanometers with low power consumption.

SUMMARY

Semiconductor structures as well as methods and apparatus for forming such semiconductor structures, for example an NMOS gate electrode, are provided herein. In some embodiments, a method for forming a semiconductor structure includes: depositing a first capping layer having a first surface atop a first surface of a high-k dielectric layer; and depositing a metal layer having a first surface atop the first surface of the first capping layer, wherein the at least one metal layer includes titanium aluminum silicide material.

In some embodiments, a method of treating a high-k dielectric material includes: depositing a first capping layer having a first surface atop a high-k dielectric layer; depositing one or more metal work function layers atop the first surface of the first capping layer, wherein the one or more metal work function layers comprises titanium aluminum silicide (TiAlSi), depositing a second capping layer atop the one or more metal work function layers; and optionally, depositing a second metal layer atop the second capping layer.

In some embodiments, an NMOS gate electrode includes: a first capping layer having a first surface atop a first surface of a high-k dielectric layer; and a metal work function layers atop the first surface of the first capping layer, wherein the metal work function layer comprises titanium, aluminum, and silicon material.

In some embodiments, the present disclosure relates to a non-transitory computer readable medium having instructions stored thereon that, when executed, cause a method of forming a semiconductor structure, including: depositing a first capping layer having a first surface atop a first surface of a high-k dielectric layer; and depositing a metal layer having a first surface atop the first surface of the first capping layer, wherein the metal layer comprises titanium aluminum silicide material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of present disclosure provide semiconductor structures and methods of forming semiconductor structures. In embodiments, deposition methods of titanium aluminum silicide material on semiconductor substrates using vapor deposition techniques are disclosed. For example, in some embodiments, a method of forming a semiconductor structure, includes: depositing a first capping layer having a first surface atop a first surface of a high-k dielectric layer; and depositing a metal layer having a first surface atop the first surface of the first capping layer, wherein the metal layer includes titanium aluminum silicide material. Embodiments of the present disclosure provide methods for forming one or more n-metal work function materials or layers over a substrate that advantageously include titanium aluminum silicide material with low resistivity suitable for forming an NMOS gate electrode with low power consumption. The aluminum content of the titanium aluminum silicide material may be varied to tune the work function of the titanium aluminum silicide material. A tuned work function in accordance with the present disclosure may be suitable to obtain a desired threshold voltage (Vt) in a semiconductor device. Embodiments of the present disclosure may advantageously be formed using atomic layer deposition (ALD) processes and used within devices that may be subjected to further processing. In some embodiments, methods of the present disclosure advantageously provide n-metal work function titanium aluminum silicide material such as a film having a desired or predetermined n-work function suitable for use in fin field-effect transistors (FinFET) in the 10 nm technology node and beyond. In embodiments, the desired work function of an n-metal film of the present disclosure is predetermined. For example, the desired work function of an n-metal film of the present disclosure may be targeted to be below 4.25 eV at 15 angstrom (A) thickness.

Figure 1:
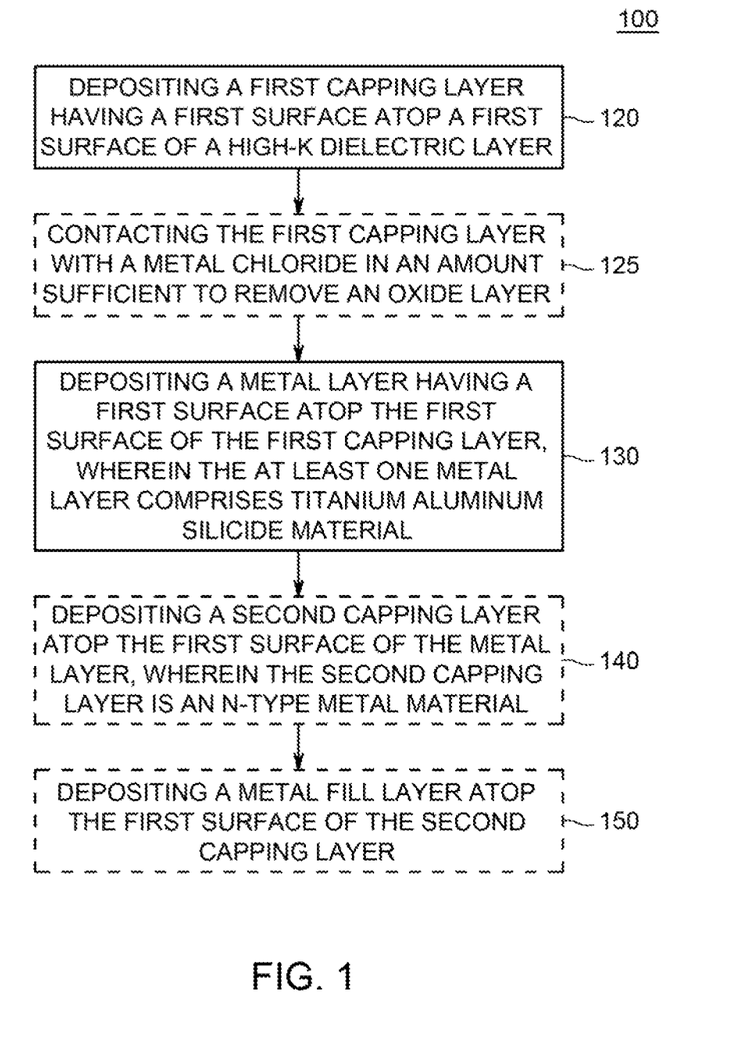
FIG. 1 is a flowchart of a method of forming a semiconductor device in accordance with some embodiments of the present disclosure.

FIG. 1 is a flow diagram of a method 100 for forming a metal layer, wherein the metal layer includes titanium aluminum silicide material in accordance with embodiments of the present disclosure. The method 100 is described below with respect to the stages of depositing a metal layer including titanium aluminum silicide material as depicted in FIGS. 2A-2E and may be performed, for example, in a suitable process chamber such as process chamber 16 in FIG. 3. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. Non-limiting examples of suitable cluster tools and process chambers are disclosed in commonly-owned U.S. Pat. No. 7,405,158, issued Jul. 29, 2008 to Lai et al. Other process chambers, including ones available from other manufacturers, may also be suitably used in connection with the teachings provided herein.

Figure 2A:
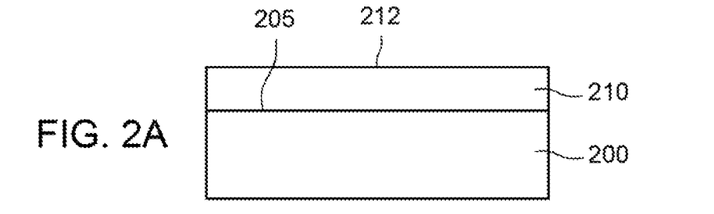
FIGS. 2A-2E are illustrative cross-sectional views of the substrate during different stages of the processing sequence of FIG. 1 in accordance with some embodiments of the present disclosure.

The method 100 is typically performed on a substrate 200 provided to a processing volume of a process chamber, such as a process chamber suitable for performing cyclical deposition such as atomic layer deposition. Although not shown in FIG. 1, in embodiments, a substrate 200 to be processed is first loaded into and positioned within a process chamber 16 capable of performing cyclical deposition and the process conditions are adjusted. In some embodiments, as shown in FIG. 2A, the substrate 200 includes a first surface 205 and a high-k dielectric layer 210 atop the first surface 205 of substrate 200. The high-k dielectric layer 210 having a first surface 212. Although the following description is made with respect to a substantially planar substrate 200 as shown in FIGS. 2A-2E, in some embodiments, substrate 200 may include one or more features (such as a plurality of trenches, vias or the like) (not shown in FIGS. 2A-2E).

The substrate 200 may be any suitable substrate. For example, the substrate 200 may include one or more of silicon (Si), silicon oxide ($SiO_2$), or the like. In embodiments, the substrate 200 is an oxide substrate. In embodiments, the substrate 200 may include a dielectric layer or dielectric substrate. For example, a low-k material (e.g., a material having a dielectric constant less than silicon oxide, or less than about 3.9), or the like may be suitable for use herein. In addition, the substrate 200 may include additional layers of materials or may have one or more completed or partially completed structures or devices formed in or on the substrate 200 (not shown). In embodiments, the substrate 200 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer. In embodiments the substrate 200 is an oxide substrate, dielectric substrate, or combinations thereof. The substrate 200 is not limited to any particular size or shape. The substrate 200 can be a round wafer having a 200 mm diameter, a 300 mm diameter or other diameters, such as 450 mm, among others. The substrate 200 can also be any polygonal, square, rectangular, curved or otherwise non-circular workpiece, such as a polygonal glass substrate used in the fabrication of flat panel displays.

In embodiments, a high-k dielectric layer 210 may be deposited upon the first surface 205 of substrate 200. In embodiments, the high-k dielectric layer 210 is suitable for use in an n-type device. The high-k dielectric layer 210 may be deposited by any deposition means known in the art to a predetermined thickness to form a film. In embodiments, high-k dielectric layer 210 is made of material with high dielectric constants (high-k materials have dielectric constants greater than 4.0) such as hafnium(IV) oxide ($HfO_2$), zirconium dioxide ($ZrO_2$), aluminum oxide ($Al_2O_3$), barium strontium titanate (BST), lead zirconate titanate (PZT), zirconium silicate ($ZrSiO_2$), hafnium silicon dioxide ($HfSiO_2$), tantalum dioxide ($TaO_2$), and the like. In embodiments, suitable high-k dielectric layers comprise high-k oxides grown by atomic layer deposition to form a thin film having a thickness on the amount of 1 to 3 nanometers such as about 2.5 nanometers.

Figure 2B:
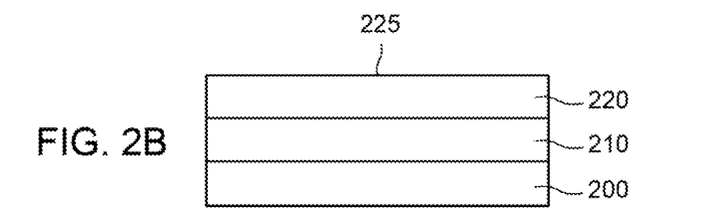

Referring to FIG. 1, at 120, and FIG. 2B, method 100 includes depositing a first capping layer 220 having a first surface 225 atop a first surface 212 of a high-k dielectric layer 210. In embodiments, the first capping layer is a material suitable for use in an n-type device deposited by any suitable deposition technique such as chemical vapor deposition (CVD) or atomic layer deposition (ALD). In embodiments the first capping layer 220 is formed of titanium nitride (TiN) or tantalum nitride (TaN). In embodiments, first capping layer 220 is deposited to a thickness of 5 to 20 angstroms such as about 10 angstroms. In embodiments, the first capping layer may affect the performance of a transistor device. For example, if the first capping layer contains too much oxygen (O), or an oxide layer or native oxide layer (not shown) atop the first surface 225 of the first capping layer 220, the threshold voltage of the transistor device including the gate electrode may be negatively impacted. By treating the first capping layer 220 such as shown at 125 by contacting the first capping layer 220 with a metal chloride in an amount sufficient to remove any oxide layer disposed upon first surface 225 of the first capping layer 220, the inventors have found that the threshold voltage of the transistor device is positively impacted. For example, prior to depositing a first metal layer, embodiments, include removing an oxide layer from the first surface 225 of the first capping layer 220. Non-limiting examples of metal halides suitable for use in accordance with the present disclosure include tantalum chloride, nickel chloride, tungsten chloride, tungsten oxytetrachloride, hafnium chloride, aluminum chloride, and combinations thereof. In embodiments, metal chlorides are contacted with the first surface 225 of the first capping layer 220 under conditions sufficient to remove an oxide layer such as a native oxide layer disposed upon the first surface 225 of the first capping layer 220. In embodiments, metal chlorides are contacted with the first surface 225 of the first capping layer 220 at a temperature ranging from 300 degrees Celsius to 450 degrees Celsius, pressure of 1 to 20 Torr, for a duration of 1 second to 600 seconds. In embodiments, the first capping layer is deposited to a thickness of about 5 to 15 angstroms.

Figure 2C:
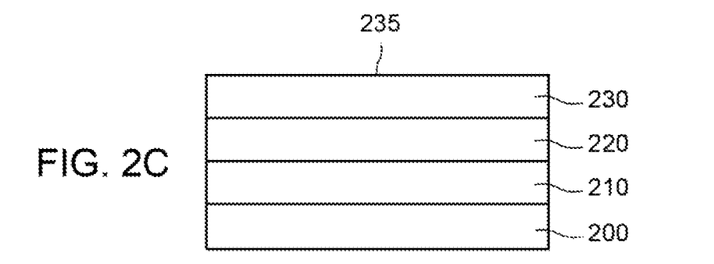

Referring to FIG. 1, at 130, and FIG. 2C, method 100 includes depositing a metal layer 230 having a first surface 235 atop the first surface 225 of the first capping layer 220, wherein the metal layer comprises titanium, aluminum, and silicon such as a TiAlSi alloy. The metal-containing layer may be, for example, a metal, or a metal titanium aluminum silicide material. In embodiments, the metal layer includes titanium in an amount of 30 to 50 atomic percent or 40 to 50 atomic percent, aluminum in an amount of 1 to 15 atomic percent aluminum, and silicon in an amount of 20 to 40 atomic percent. In embodiments, the titanium aluminum silicide material includes 1-10% of carbon. In embodiments, the metal layer is TiAlSi alloy having a thickness of about 10 to 50 angstroms. In embodiments, the metal layer comprises or consists of a compound that includes titanium, aluminum, and silicon as a solid-state compound. In embodiments, the solid-state compound may be characterized as an intermetallic material such as a metal alloy that forms a solid-state compound including silicon therein, and the compound has an ordered crystalline structure such that the position of two or more atoms is determined and not random.

Figure 3:
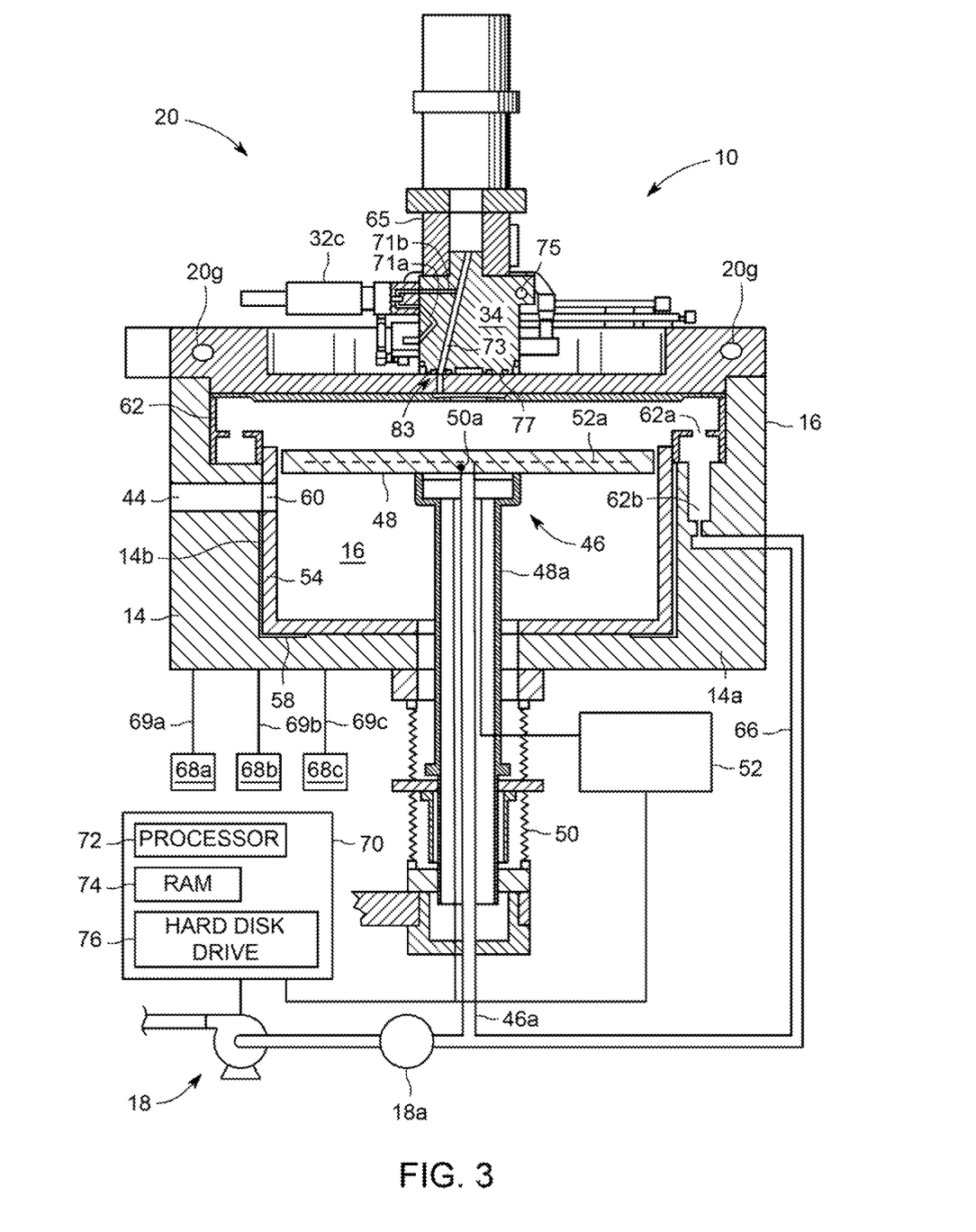
FIG. 3 is a device suitable for performing methods and forming devices in accordance with the present disclosure.

During process 130, a substrate 200 of FIG. 2C is heated to an initial deposition temperature within a process chamber 16 of FIG. 3. The substrate 200 may be heated to a temperature within a range from about 350 degrees Celsius to about 470 degrees Celsius, from about 400 degree Celsius to about 450 Celsius. The substrate 200 including high-k dielectric layer 210 and first capping layer 220 are then contacted with precursors sufficient to form a titanium, aluminum, and silicone (TiAlSi) layer thereon. In embodiments, a precursor characteristic is to have a favorable vapor pressure. Deposition precursors may have gas, liquid or solid states at ambient temperature and pressure. However, within the process chamber 16, precursors may be volatilized as gas. The process chamber 16 has a controlled environment that is pressurized within a range from about 1 mTorr to about 100 Torr, from about 1 Torr to about 10 Torr, or from about 2 Torr to about 5 Torr. Precursors are usually heated prior to delivery into the process chamber, such as at a temperature from about room temperature to about 200 degrees Celsius.

In embodiments, the substrate 200 is subsequently exposed to a titanium precursor containing gas, an aluminum precursor containing gas, and a silicon containing gas in an ALD sequence to form a monolayer of titanium, aluminum, and silicon, or TiAlSi alloy as described herein on the first capping layer 220. A purge gas may also be used to purge the processing chamber 16 in between or during deposition cycles. The carrier gas and purge gas may be one or more of argon, nitrogen, hydrogen, helium, forming gas ($N_2/H_2$), or combinations thereof. In one ALD embodiment, the purge gas is continuously cycled through the process chamber while the precursor gases are sequentially pulsed there through. In embodiments, the pulsed precursor gases are temporally separated.

In embodiments, at 130, a method in accordance with the present disclosure may use a layer deposition (ALD) to form a metal layer 230 such as a film composition of the titanium, aluminum, and silicon so that the work function value can be controlled or predetermined. For example, in embodiments, a reactive gas including a precursor for titanium may be contacted with the workpiece including the substrate 200, high-k dielectric layer 210 and first capping layer 220. In embodiment, depositing the metal layer 230 is performed by atomic layer deposition. Non-limiting examples of suitable precursor of titanium (Ti) may include one of $TiCl_4$, TiF4, TiBr4, TiI4, TDEAT (tetrakis diethylaminotitanium), TDMAT (tetrakis dimethylaminotitanium), and combinations thereof. The precursor of titanium may be contacted with the first capping layer 220 under conditions suitable for forming a monolayer of aluminum on the first capping layer 220. For example, one or more precursors of titanium may be supplied in a process gas including a reactive gas, wherein the temperature of the substrate 200 is about 350 degrees Celsius to about 475 degrees Celsius at the pressure ranging from about 0.05 to about 20 Torr. In one embodiment, depositing at least one metal layer is performed at a temperature of 350 to 475 degrees Celsius. In embodiments, the composition of titanium (Ti) may be controlled by the number of each of the cycles, the pulse duration, and/or the concentration of the titanium in the precursor gas. In embodiments, titanium is provided in a precursor gas in an amount sufficient to form a metal layer 230 of TiAlSi, wherein the metal layer comprises titanium in an amount of 30 to 50 atomic percent.

In embodiments, a reactive gas in an ALD deposition may include a precursor for aluminum. In embodiments, precursor of aluminum may be contacted with the workpiece including the substrate 200, high-k dielectric layer 210 and first capping layer 220. Non-limiting examples of suitable precursor of aluminum may include one or more of $AlCl_3$ and TMA[Al(CH$_3$)$_3$], triethylaluminum (Al$_2$Et$_6$, (AlEt$_3$)$_2$, or TEA), dimethylaluminum hydride (DMAH), tritertiarybutyl aluminium (TTBA), aluminum hydride (AlH$_3$), and combinations thereof. In some embodiments, a hydrogen-based plasma, or plasma formed from hydrogen gas, may be used for including aluminum in the deposited materials. In embodiments, the precursor of aluminum may be contacted with the first capping layer 220 under conditions suitable for forming a monolayer of aluminum on the first capping layer 220. For example, one or more precursors of aluminum may be supplied in a process gas including a reactive gas, wherein the temperature of the substrate is about 350 degrees Celsius to about 475 degrees Celsius at a pressure ranging from about 0.05 to about 20 Torr. In some embodiments, the composition of aluminum (Al) may be controlled by the number of each of the cycles, the pulse duration, and/or the concentration of the aluminum in the precursor gas. In embodiments, aluminum is provided in a precursor gas in an amount sufficient to form a metal layer 230 of TiAlSi, wherein the metal layer comprises aluminum in an amount of 1 to 15 atomic percent, or in embodiments, 1 to 10 atomic percent.

In embodiments, a reactive gas in an ALD deposition may include a precursor for silicon. In embodiments, the precursor for silicon includes silicon-containing reactive gas may be used for silicon-containing material depositions, such as silicides. Silicon-containing precursors include silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Organosilanes include compounds with the empirical formula $R_ySi_xH_{(2x+2-y)}$, where R is independently methyl, ethyl, propyl or butyl, such as methylsilane ((CH$_3$)SiH$_3$), dimethylsilane ((CH$_3$)$_2$SiH$_2$), ethylsilane ((CH$_3$CH$_2$)SiH$_3$), methyldisilane ((CH$_3$)Si$_2$H$_5$), dimethyldisilane ((CH$_3$)$_2$Si$_2$H$_4$), hexamethyldisilane ((CH$_3$)$_6$Si$_2$), tris(dimethylamino)silane (TDMAS), and combinations thereof. In embodiments, the precursor of silicon may be contacted with the first capping layer 220 under conditions suitable for forming a monolayer of silicon on the first capping layer 220. For example, one or more precursors of silicon may be supplied in a process gas including a reactive gas, wherein the temperature of the substrate is about 350 degrees Celsius to about 475 degrees Celsius at a pressure ranging from about 0.05 to about 20 Torr. The composition of silicon (Si) may be controlled by the number of each of the cycles, the pulse duration, and/or the concentration of the silicon in the precursor gas. In embodiments, silicon is provided in a precursor gas in an amount sufficient to form a metal layer 230 of TiAlSi, wherein the metal layer comprises silicon in an amount of 30 to 40 atomic percent.

In some embodiments, one or more metal work function layers may be deposited by reacting at least one titanium halide precursor, at least one aluminum precursor, and at least one silane precursor.

During the time between cycles when the titanium, aluminum, and silicon film is deposited using the precursor, a purge gas as described above may be used. In addition, the content of the deposited film may be controlled, for example, by lengthening or decreasing the pulse time of one or more precursors of titanium, aluminum, or silicon, or combinations thereof. In embodiments, depositing metal layers at 130 includes depositing at least one metal layer comprising cyclically depositing a first titanium monolayer, a first aluminum monolayer, and a first silicon monolayer to form a titanium aluminum silicide (TiAlSi) material. In embodiments, the ALD cycles can be repeated for example, 100 to 1000 times or more to form a layer of TiAlSi of predetermined thickness. In embodiments the TiAlSi material comprises titanium in an amount of 30 to 50 atomic percent or 40 to 50 atomic percent, aluminum in an amount of 1 to 10 atomic percent, and silicon in an amount of 20 to 40 atomic percent. In embodiments, the TiAlSI material comprises 20 to 40 atomic percent silicon. In embodiments, carbon in an amount of 5 to 10 atomic percent may be present in the metal layer. In embodiments, the TiAlSi may be substantially pure having less than 0.001 percent impurities.

In embodiments, depositing metal layer at 130 includes depositing one or more metal work function layers including one or more sequential cycles of: a) introducing a metal halide precursor such as titanium halide, into a processing chamber to form a first monolayer on the first capping layer; b) purging the metal halide precursor using a purge gas; c) introducing at least one aluminum precursor to form a second monolayer on the first capping layer; d) purging the aluminum precursor using a purge gas; e) introducing at least one silane precursor to form a third monolayer on the first capping surface, wherein a) through e) form a titanium aluminum silicide layer atop the first capping layer. In embodiments, after f) a purge gas may be applied; and the cycle a-f may be repeated 1 to 100 times or more to obtain a TiAlSi layer of predetermined thickness.

Figure 2D:
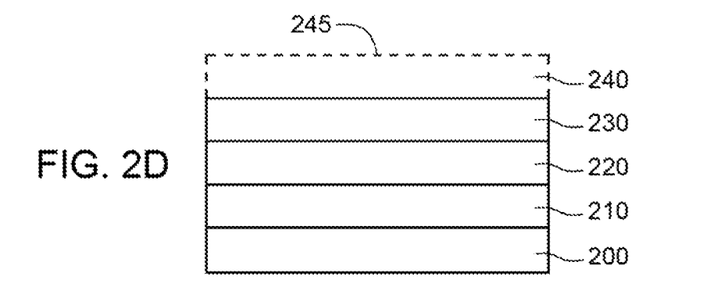

Referring to FIG. 1, at 140, and FIG. 2D, method 100 includes, optionally, depositing a second capping layer 240 having a first surface 245 atop a first surface 235 of metal layer 230. In embodiments, in depositing a second capping layer atop the first surface of the metal layer, the second capping layer is an n-type metal material. In embodiments, the second capping layer is a material suitable for use in an n-type device deposited by any suitable deposition technique such as chemical vapor deposition (CVD) or atomic layer deposition (ALD). In embodiments the second capping layer is formed of titanium nitride (TiN) or tantalum nitride (TaN).

In embodiments, second capping layer 240 is deposited to a thickness of 5 to 20 angstroms such as about 10 angstroms.

Figure 2E:
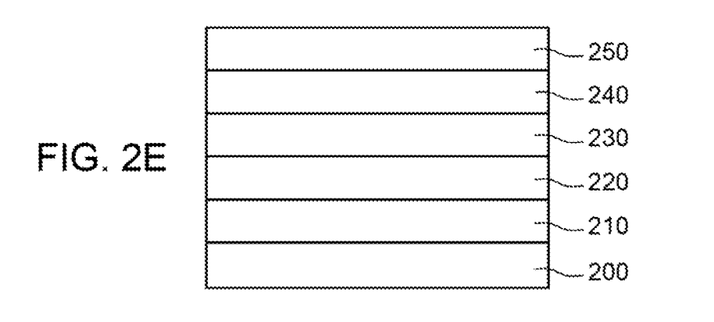

Referring to FIG. 1, at 150 and FIG. 2E, method 100 includes, optionally, depositing a gate fill material upon the first surface 245 of the second capping layer 240. In embodiments, the gate fill material is a material suitable for use in an n-type device deposited by any suitable deposition technique such as chemical vapor deposition (CVD) or atomic layer deposition (ALD). In embodiments the gate fill material is formed of tungsten, titanium, or other metal suitable for use in an n-type transistor. In embodiments, gate fill material is deposited to a thickness of 20 angstroms to 2 or 3 nanometers. In embodiments, the metal layer 230 and the metal gate fill material 250 may be the same or different material depending on the respective conductivity desired for a device such as a gate electrode. If, for example, a metal gate fill material 250 is used that is different than the work function material, the metal gate fill material 250 may include an electrically conductive material, such as a metal or a metal alloy. Non-limiting examples of a metal or a metal alloy for use as a metal gate fill material 250 include materials from the group of tungsten, aluminum, copper, cobalt, and combinations thereof, and alloys of tungsten, aluminum, copper, cobalt and combinations thereof.

In some embodiments, the metal gate fill material 250 used is the same or substantially the same as the work function material, and the metal gate fill material 250 may comprise the titanium, aluminum, silicon materials described herein such as TiAlSi and be deposited by the processes described herein. Alternatively, in some embodiments, the metal layer 230 (such a as a work function material layer) and the metal gate fill material 250 may be different materials that are both selected from the materials described herein. In one embodiment, a high dielectric constant material comprises or consists of hafnium oxide, a metal layer 230 suitable as a work function material may comprise or consists of TiAlSi, and a gate fill material may be tungsten. In embodiments, the gate fill material should have an equal or lesser resistivity than the work function material layer or metal layer 230.

Referring to FIG. 3, a process chamber 16 suitable for forming the layer of the present disclosure including metal layer 230 in a single process chamber is shown. In embodiments, process chamber 16 may be configured to operate in both CVD mode and a cyclical deposition mode (ALD). One example of such a chamber is described in U.S. Pat. No. 6,878,206 entitled Lid Assembly for a Processing System to Facilitate Sequential Deposition Techniques filed on Dec. 12, 2001, and assigned to Applied Materials. Referring to FIG. 3, disposed within process chamber 16 is a heater/lift assembly 46 that includes a support pedestal 48 connected to a support shaft 48a suitable for supporting a wafer. The support pedestal 48 is positioned between the support shaft 48a and the lid assembly 20 when the lid assembly 20 is in the closed position. The support shaft 48a extends from the support pedestal 48 away from lid assembly 20 through a passage formed in the housing 14. A bellows 50 is attached to a portion of the housing 14 disposed opposite to the lid assembly 20 to prevent leakage into the process chamber 16 from between the support shaft 48a and housing 14. The heater/lift assembly 46 may be moved vertically within the process chamber 16 so that a distance between support pedestal 48 and lid assembly 20 may be controlled. A sensor (not shown) provides information concerning the position of support pedestal 48 within process chamber 16.

The support pedestal 48 includes an embedded thermocouple 50a that may be used to monitor the temperature thereof. For example, a signal from the thermocouple 50a may be used in a feedback loop to control power applied to a heater element 52a by a power source 52. The heater element 52a may be a resistive heater element or other thermal transfer device disposed in or in contact with the support pedestal 48 utilized to control the temperature thereof. Optionally, support pedestal 48 may be heated using a heat transfer fluid (not shown).

The support pedestal 48 may be formed from any process-compatible material, including aluminum nitride and aluminum oxide ($Al_2O_3$ or alumina) and may also be configured to hold a substrate 200 (not shown) thereon employing a vacuum, i.e. support pedestal 48 may be a vacuum chuck. To that end, support pedestal 48 may include a plurality of vacuum holes (not shown) that are placed in fluid communication with a vacuum source, such as pump system via vacuum tube routed through the support shaft 48a.

A liner assembly is disposed in the process chamber 16 and includes a cylindrical portion 54 and a planar portion 56. The cylindrical portion 54 and the planar portion 56 may be formed from any suitable material such as aluminum, ceramic and the like. The cylindrical portion 54 surrounds the support pedestal 48. The cylindrical portion 54 additionally includes an aperture 60 that aligns with the slit valve opening 44 disposed a side wall 14b of the housing 14 to allow entry and egress of substrates from the process chamber 16.

The planar portion 56 extends transversely to the cylindrical portion 54 and is disposed against a chamber bottom 14a of process chamber 16 disposed opposite to lid assembly 20. The liner assembly defines a channel 58 between the housing 14 and both cylindrical portion 54 and planar portion 56. Specifically, a first portion of channel 58 is defined between the chamber bottom 14a and planar portion 56. A second portion of channel 58 is defined between the side wall 14b of the housing 14 and the cylindrical portion 54. A purge gas is introduced into the channel 58.

Disposed along the side walls 14b of the process chamber 16 proximate the lid assembly 20 is a pumping channel 62. The pumping channel 62 includes a plurality of apertures, one of which is shown as a first aperture 62a. The pumping channel 62 includes a second aperture 62b that is coupled to a pump system 18 by a conduit 66. A throttle valve 18A is coupled between the pumping channel 62 and the pump system 18. The pumping channel 62, throttle valve 18A and pump system 18 control the amount of flow from the process chamber 16. The size and number and position of apertures such as first aperture 62a in communication with the process chamber 16 are configured to achieve uniform flow of gases exiting the lid assembly 20 over support pedestal 48 and substrate 200 when seated thereon. A plurality of supplies 68a, 68b and 68c of process and/or other fluids, are in fluid communication with one of valves 32a, 32b or 32c through a sequence of conduits (not shown) formed through the housing 14, lid assembly 20, and gas manifold 34.

A controller 70 regulates the operations of the various components of system 10. The controller 70 includes a processor 72 in data communication with memory, such as random-access memory 74 and a hard disk drive 76 and is in communication with at least the pump system 18, the power source 52, and valves 32a, 32b and 32c. The random-access memory 74 includes instructions stored thereon that, when read by the processor 72, control the operation of the system 10 to perform methods as disclosed herein on the structures described herein within the process chamber. In some embodiments, the controller comprises a computing device including one or more computer readable media. Computer readable media generally includes any device, located either locally or remotely, which is capable of storing information that is retrievable by a computing device. Examples of computer readable media useable with embodiments of the present disclosure include solid state memory, floppy disks, internal or external hard drives, and optical memory (CDs, DVDs, etc.). In one embodiment, the random-access memory 274 may be a computer readable media. Software routines may be stored on the computer readable media to be executed by the computing device. The software routines, when executed, transform a general-purpose computer into a specific process computer that controls the chamber operation so that a chamber process is performed.

Although any type of process fluid may be employed, one example of process fluids are precursors as described above, and optionally a purge fluid as described above such as argon (Ar) gas. Nitrogen ($N_2$) may also be used as a purge gas. The chamber pressure may be in the pressure range as described above, or may be in the range of 1-150 Torr or 1-50 Torr, and the support pedestal 48 is heated in the range of 300 degree Celsius to 500 degrees Celsius, such that the substrate may be maintained at a set temperature, such as the substrate at a temperature of 350 degrees Celsius to about 470 degrees Celsius, or 400 degrees Celsius to about 450 degrees Celsius. In embodiments, the process fluids such as precursors may be flowed into the process chamber 16 with a carrier fluid, such as argon (Ar). However, the purge fluid might differ from the carrier fluid or precursors, oxygen containing gas, or reactive gas.

In vapor deposition embodiments in accordance with the present disclosure, the methods include performing an atomic layer deposition (ALD) process to deposit a TiAlSi layer(s) as described above on the first capping layer. One cycle of ALD may include flowing one or more titanium precursors into process chamber 16 including a substrate, purging process chamber 16 such as pumping to remove all process fluids, and, after pumping supplying a reactive gas such as an aluminum precursor containing gas. A subsequent purge may be performed to remove unreacted reactive gas, precursors, or by-products thereof. After pumping supplying a reactive gas such as a silicon precursor containing gas. A subsequent purge may be performed to remove unreacted reactive gas, precursors, or by-products thereof. In embodiments, the ALD sequence of cycles is repeated until the layer being formed has desired characteristics, such as thickness, conductivity and the like. In embodiments, the ALD sequence of cycles is repeated until the layer being formed has desired characteristics, such as quantity of aluminum, quantity of titanium, or predetermined quantity of silicon. In some embodiments, purge gases may be strategically delivered through the lower portion of the passage 73, sweeping off cleaning agents from the gas manifold 34 and baffle plate.

Figure 4:
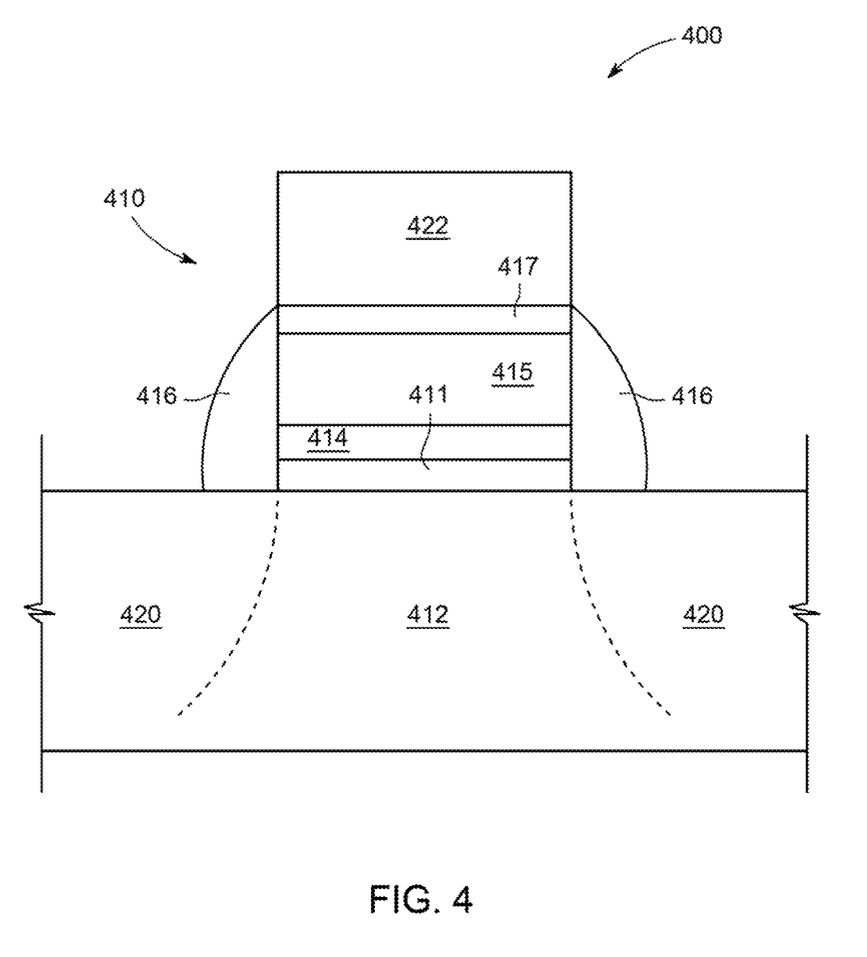
FIG. 4 is an NMOS gate electrode of the present disclosure.

FIG. 4 shows a cross sectional view of an exemplary metal oxide gate device 400 utilizing a metal layer deposited by ALD according to embodiments of the present disclosure. The device such as exemplary metal oxide gate device 400 generally includes an exposed metal gate 410 surrounded by spacers 416 and silicon source/drain areas 420 formed within a substrate 412 or surface thereof. The spacers 416 typically include an oxide, such as silicon dioxide, or a nitride, such as silicon nitride.

The exposed metal gate 410 includes a high-k dielectric layer 411, a first capping layer 414, a metal layer 415, a second capping layer 417 and a gap fill layer 422 such as a tungsten layer. The high-k dielectric layer 411 separates the substrate 412 from the first capping layer 414. The first capping layer 414 separates the high-k dielectric layer 411 and metal layer 415. In embodiments, the metal layer 415 is deposited by techniques in accordance with the present disclosure. In embodiments, all layers may be deposited by cyclical deposition techniques such as ALD.

Figure 5:
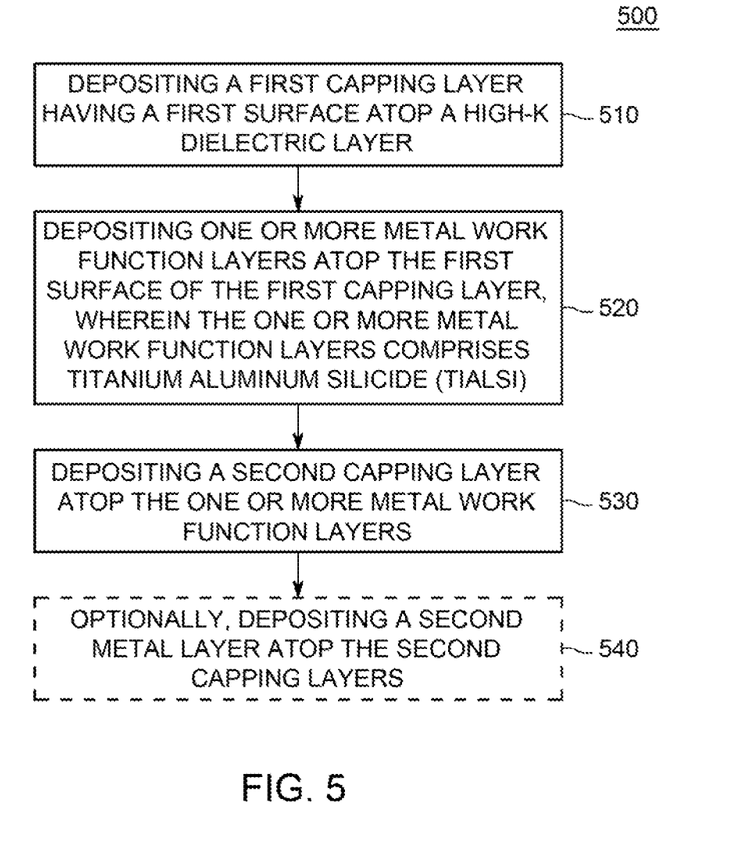
FIG. 5 is a flowchart of a method of treating a high-k dielectric material in accordance with some embodiments of the present disclosure.

FIG. 5 is a flow diagram of a method 500 for treating a high-k dielectric material is shown including, at 510, depositing a first capping layer having a first surface atop a high-k dielectric layer. In embodiments, the first capping layer and high-k dielectric layer are the same materials deposited under the same conditions as described above. In embodiments, the first capping layer and high-k dielectric layer may be deposited by cyclical deposition techniques such as ALD. Subsequent to depositing at 510, at 520 method of the present disclosure include depositing one or more metal work function layers atop the first surface of the first capping layer, wherein the one or more metal work function layers comprises titanium aluminum silicide (TiAlSi). In embodiments, the one or more metal work function layers are the same as metal layer 230 shown in FIG. 2C as described above. In embodiments, the one or more metal work function layers are deposited by cyclically depositing a first titanium monolayer, a first aluminum monolayer, and a first silicon monolayer to form a titanium aluminum silicide (TiAlSi) material. In embodiments, the ALD cycles can be repeated for example, 1 to 100 times or more to form one or more metal work function layers of TiAlSi of predetermined thickness. In embodiments the TiAlSi metal work function layer includes titanium in an amount of 30 to 50 atomic percent, aluminum in an amount of 1 to 15 atomic percent, and silicon in an amount of 20 to 40 atomic percent. In embodiments, the one or more metal work function layers may comprise carbon.

In embodiments, depositing one or more metal work function layers includes one or more sequential cycles of: a) introducing a metal halide precursor such as titanium halide, into a processing chamber to form a first monolayer on the first capping layer; b) purging the metal halide precursor using a purge gas; c) introducing at least one aluminum precursor to form a second monolayer on the first capping layer; d) purging the aluminum precursor using a purge gas; e) introducing at least one silane precursor to form a third monolayer on the first capping surface, wherein a) through e) form a titanium aluminum silicide layer atop the first capping layer. In embodiments, after f) a purge gas may be applied; and the cycle (a-f) may be repeated 1 to 100 times or more to obtain a TiAlSi layer of predetermined thickness.

Still referring to FIG. 5, at 530 depositing a second capping layer atop the one or more metal work function layers; and optionally, at 540 depositing a second metal layer atop the second capping layer in accordance with some embodiments of the present disclosure. The method 500 is suitable for depositing a metal layer as depicted in FIGS. 2A-2E and may be performed, for example, in a suitable cluster tool and process chamber such as process chamber 16 in FIG. 3. In some embodiments a cluster tool or process chamber such as the process chamber 16 in FIG. 3 is configured for depositing a first capping layer having a first surface atop a first surface of a high-k dielectric layer; and depositing a metal layer having a first surface atop the first surface of the first capping layer, wherein the metal layer comprises titanium aluminum silicide material.

In some embodiments, the present disclosure relates to a non-transitory computer readable medium having instructions stored thereon that, when executed, cause a method of forming a semiconductor structure, including: depositing a first capping layer having a first surface atop a first surface of a high-k dielectric layer; and depositing a metal layer having a first surface atop the first surface of the first capping layer, wherein the metal layer comprises titanium aluminum silicide material.

In some embodiments, the present disclosure relates to a non-transitory computer readable medium having instructions stored thereon that, when executed, cause a method of treating a high-k dielectric material comprising: depositing a first capping layer having a first surface atop a high-k dielectric layer; depositing one or more metal work function layers atop the first surface of the first capping layer, wherein the one or more metal work function layers comprises titanium aluminum silicide (TiAlSi), depositing a second capping layer atop the one or more metal work function layers; and optionally, depositing a second metal layer atop the second capping layer.

In some embodiments a cluster tool or process chamber such as the process chamber 16 in FIG. 3 is configured for forming an NMOS gate electrode comprising: a first capping layer having a first surface atop a first surface of a high-k dielectric layer; and a metal work function layers atop the first surface of the first capping layer, wherein the metal work function layer comprises titanium, aluminum, and silicon material.

In some embodiments, the present disclosure relates to a method for forming a semiconductor structure, including: depositing a first capping layer having a first surface atop a first surface of a high-k dielectric layer; and depositing a metal layer having a first surface atop the first surface of the first capping layer, wherein the metal layer comprises titanium aluminum silicide material. In some embodiments, prior to depositing the metal layer, an oxide layer is removed from the first surface of the first capping layer. In some embodiments, removing the oxide layer includes contacting the first capping layer with a metal chloride in an amount sufficient to remove an oxide layer. In some embodiments, depositing the metal layer is performed at a temperature of 350 to 470 degrees Celsius. In some embodiments, depositing the metal layer is performed by atomic layer deposition. In some embodiments, the methods further include depositing a second capping layer atop the first surface of the metal layer, wherein the second capping layer is an n-type metal material. In some embodiments, the first capping layer comprises titanium nitride (TiN) or tantalum nitride (TaN). In some embodiments, depositing at least one metal layer includes cyclically depositing a first titanium monolayer, a first aluminum monolayer, and a silicon monolayer to form a titanium aluminum silicide (TiAlSi) material. In some embodiments, the metal layer is deposited to a thickness of about 10 to 50 angstroms. In some embodiments, the first capping layer is deposited to a thickness of about 5 to 15 angstroms. In some embodiments, the metal layer comprises titanium in an amount of 40 to 50 atomic percent. In some embodiments, the metal layer comprises 1 to 10 atomic percent aluminum. In some embodiments, the metal layer comprises 30 to 40 atomic percent silicon. In some embodiments, the first capping layer includes titanium nitride having a thickness of about 5 to 15 angstroms, and the metal layer is TiAlSi having a thickness of about 10 to 50 angstroms.

In some embodiments, the present disclosure relates to a method of treating a high-k dielectric material including: depositing a first capping layer having a first surface atop a high-k dielectric layer; depositing one or more metal work function layers atop the first surface of the first capping layer, wherein the one or more metal work function layers comprises titanium aluminum silicide (TiAlSi), depositing a second capping layer atop the one or more metal work function layers; and optionally, depositing a second metal layer atop the second capping layer. In some embodiments, the one or more metal work function layers is deposited by reacting at least one titanium halide precursor, at least one aluminum precursor, and at least one silane precursor. In some embodiments, depositing one or more metal work function layers comprises one or more sequential cycles of: a) introducing a metal halide precursor into a processing chamber to form a first monolayer on the first capping layer; b) purging the metal halide precursor using a purge gas; c) introducing at least one aluminum precursor to form a second monolayer on the first capping layer; d) purging the aluminum precursor using a purge gas; and e) introducing at least one silane precursor to form a third monolayer on the first capping layer, wherein a) through e) form a titanium aluminum silicide layer atop the first capping layer. In some embodiments, the method includes repeating a) through e) to form a titanium aluminum silicide layer with a predetermined thickness. In some embodiments, the method includes depositing one or more metal work function layers is performed at a temperature of 350 to 470 degrees Celsius.

In some embodiments, the present disclosure relates to a method of treating a high-k dielectric material comprising or consisting of: depositing a first capping layer having a first surface atop a high-k dielectric layer; depositing one or more metal work function layers atop the first surface of the first capping layer, wherein the one or more metal work function layers comprises or consists of titanium aluminum silicide (TiAlSi), depositing a second capping layer atop the one or more metal work function layers; and depositing a second metal layer atop the second capping layer.

While the foregoing is directed to embodiments of the present disclosure, other and further embodiments of the disclosure may be devised without departing from the basic scope thereof.

The invention claimed is:

1. A method for forming a semiconductor structure, comprising:
   depositing a first capping layer having a first surface atop a first surface of a high-k dielectric layer;
   removing an oxide layer from the first surface of the first capping layer; and
   subsequently depositing a metal layer having a first surface atop the first surface of the first capping layer, wherein the metal layer comprises titanium aluminum silicide material.

2. The method of claim 1, wherein removing the oxide layer comprises contacting the first capping layer with a metal chloride in an amount sufficient to remove an oxide layer.

3. The method of claim 1, wherein depositing the metal layer is performed at a temperature of 350 to 470 degrees Celsius.

4. The method of claim 1, wherein the depositing the metal layer is performed by atomic layer deposition.

5. The method of claim 1, further comprising depositing a second capping layer atop the first surface of the metal layer, wherein the second capping layer is an n-type metal material.

6. The method of claim 1, wherein the first capping layer comprises titanium nitride (TiN) or tantalum nitride (TaN).

7. The method of claim 1, wherein the metal layer is deposited to a thickness of about 10 to 50 angstroms.

8. The method of claim 1, wherein the first capping layer is deposited to a thickness of about 5 to 15 angstroms.

9. The method of claim 1, wherein the metal layer comprises titanium in an amount of 40 to 50 atomic percent.

10. The method of claim 1, wherein the metal layer comprises 1 to 10 atomic percent aluminum.

11. The method of claim 1, wherein the metal layer comprises 30 to 40 atomic percent silicon.

12. A method for forming a semiconductor structure, comprising:
   depositing a first capping layer having a first surface atop a first surface of a high-k dielectric layer; and
   depositing a metal layer having a first surface atop the first surface of the first capping layer, wherein the metal layer comprises titanium aluminum silicide (TiAlSi) material, wherein depositing at least one metal layer comprises cyclically depositing a first titanium monolayer, a first aluminum monolayer, and a silicon monolayer to form the titanium aluminum silicide (TiAlSi) material.

13. A method of treating a high-k dielectric material comprising:
   depositing a first capping layer having a first surface atop a high-k dielectric layer;
   depositing one or more metal work function layers atop the first surface of the first capping layer, wherein the one or more metal work function layers comprises titanium aluminum silicide (TiAlSi), and wherein the one or more metal work function layers are deposited by reacting at least one titanium halide precursor, at least one aluminum precursor, and at least one silane precursor;
   depositing a second capping layer atop the one or more metal work function layers; and
   optionally, depositing a second metal layer atop the second capping layer.

14. The method of claim 13, wherein depositing one or more metal work function layers comprises one or more sequential cycles of:
   a) introducing the titanium halide precursor into a processing chamber to form a first monolayer on the first capping layer;
   b) purging the titanium halide precursor using a purge gas;
   c) introducing the at least one aluminum precursor to form a second monolayer on the first capping layer;
   d) purging the aluminum precursor using a purge gas; and
   e) introducing the at least one silane precursor to form a third monolayer on the first capping layer, wherein a) through e) form a titanium aluminum silicide layer atop the first capping layer.

15. The method of claim 14 comprising, repeating a)-e) to form a titanium aluminum silicide layer with a predetermined thickness.

16. The method of claim 13, wherein depositing one or more metal work function layers is performed at a temperature of 350 to 470 degrees Celsius.

* * * * *